(12) United States Patent
Honda et al.

(10) Patent No.: US 8,547,429 B2
(45) Date of Patent: Oct. 1, 2013

(54) APPARATUS AND METHOD FOR MONITORING SEMICONDUCTOR DEVICE MANUFACTURING PROCESS

(75) Inventors: Toshifumi Honda, Yokohama (JP); Yuuji Takagi, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 996 days.

(21) Appl. No.: 12/379,645

(22) Filed: Feb. 26, 2009

(65) Prior Publication Data
US 2009/0231424 A1 Sep. 17, 2009

(30) Foreign Application Priority Data
Feb. 29, 2008 (JP) ................................ 2008-050078

(51) Int. Cl.
*H04N 5/253* (2006.01)
*G06K 9/00* (2006.01)

(52) U.S. Cl.
USPC ............................................. 348/87; 382/145

(58) Field of Classification Search
USPC .......................................... 382/145; 348/87
See application file for complete search history.

(56) References Cited

U.S. PATENT DOCUMENTS

| | | | |
|---|---|---|---|
| 6,259,960 B1 | 7/2001 | Inokuchi | |
| 7,570,796 B2* | 8/2009 | Zafar et al. | 382/144 |
| 7,978,902 B2* | 7/2011 | Usui et al. | 382/145 |
| 8,041,103 B2* | 10/2011 | Kulkarni et al. | 382/144 |
| 2001/0033683 A1* | 10/2001 | Tanaka et al. | 382/149 |
| 2002/0009219 A1 | 1/2002 | Matsuoka | |
| 2002/0030187 A1 | 3/2002 | Noda et al. | |
| 2005/0146714 A1 | 7/2005 | Kitamura et al. | |
| 2005/0226494 A1 | 10/2005 | Yamamoto et al. | |
| 2006/0245636 A1 | 11/2006 | Kitamura et al. | |
| 2007/0120056 A1 | 5/2007 | Nagatomo et al. | |
| 2007/0221842 A1 | 9/2007 | Morokuma et al. | |
| 2009/0136121 A1* | 5/2009 | Nakagaki et al. | 382/149 |

FOREIGN PATENT DOCUMENTS

| | | |
|---|---|---|
| JP | 10-135288 | 5/1998 |
| JP | 2002-033365 | 1/2002 |
| JP | 2002-93875 | 3/2002 |
| JP | 2004-228394 | 8/2004 |
| JP | 2005-277395 | 10/2005 |
| JP | 2007-147366 | 6/2007 |
| JP | 2007-149055 | 6/2007 |
| JP | 2007-248087 | 9/2007 |

* cited by examiner

*Primary Examiner* — Aaron Strange
(74) *Attorney, Agent, or Firm* — Antonelli, Terry, Stout & Kraus, LLP.

(57) ABSTRACT

A hotspot searching apparatus manufactures a small number of chips or regions on a semiconductor wafer under respectively different manufacturing process conditions, compares SEM images of their external appearances to output a point having large differences as a narrow process window, that is, a process monitoring point that should be managed in mass production, the narrow process window having a narrow manufacturing process condition (exposure condition) in the manufacturing of the semiconductor wafer, and sets the point as a measurement point by a CD-SEM apparatus, such that it extracts and determines plural circuit pattern parts having a narrow manufacturing process margin as the process monitoring point in a short time and a process monitoring point monitoring performs shape inspection or shape length measurement in detail at high resolution.

20 Claims, 11 Drawing Sheets

| # | THRESHOLD VALUE OF DIFFERENCE BRIGHTNESS | SIZE (nm²) | SUM (MAX(DIFFERENCE-THRESHOLD, 0)) |
|---|---|---|---|
| 1 | 5 | 50 | 80 |
| 2 | 5 | 60 | 90 |
| : | 10 | 100 | 150 |
| N | 20 | 200 | 250 |

F I G . 3
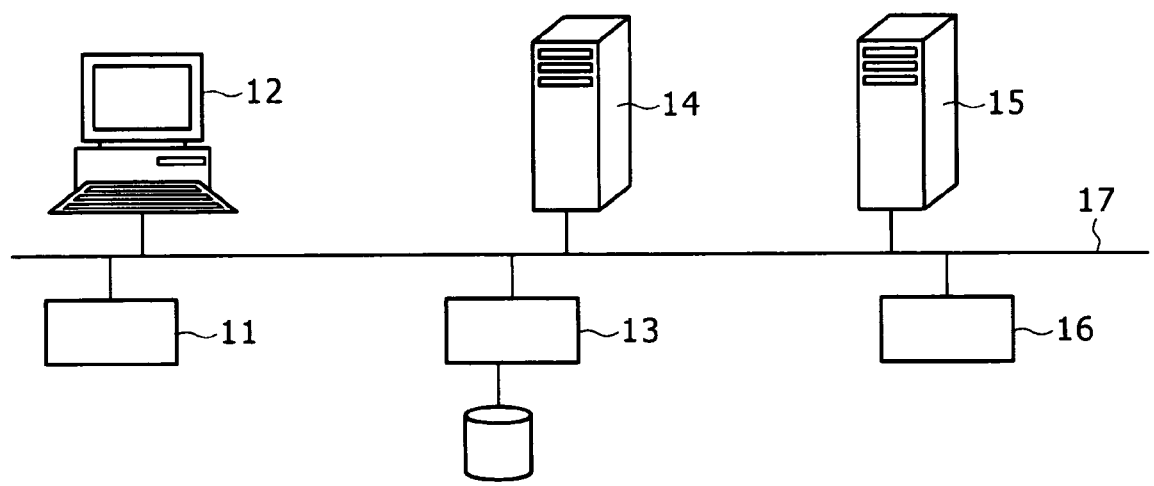

FIG.7
| # | THRESHOLD VALUE OF DIFFERENCE BRIGHTNESS | SIZE (nm²) | SUM(MAX(DIFFERENCE-THRESHOLD, 0)) |
|---|---|---|---|
| 1 | 5 | 50 | 80 |
| 2 | 5 | 60 | 90 |
| : | 10 | 100 | 150 |
| N | 20 | 200 | 250 |
FIG.8A
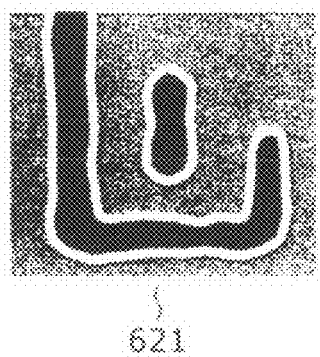
621
FIG.8B
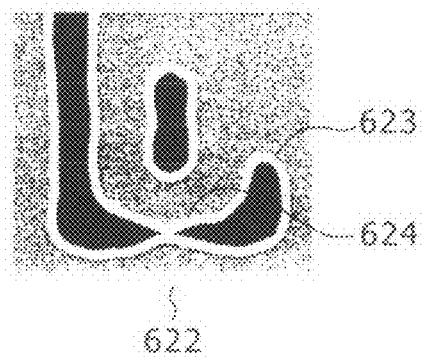
623
624
622

FIG.10A
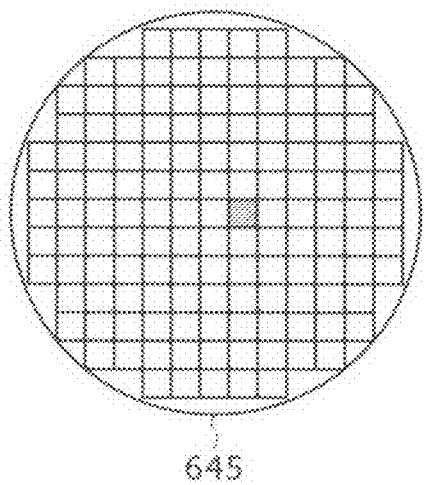
645
FIG.10B
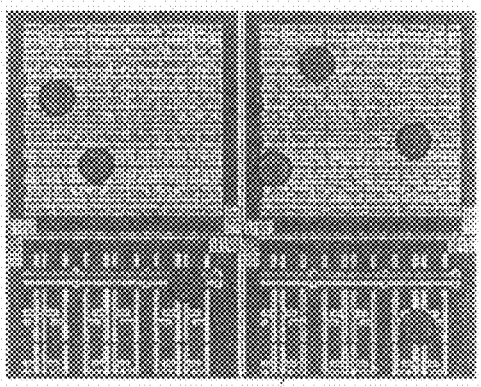
641
FIG.10C
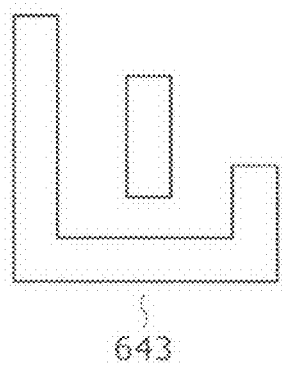
643
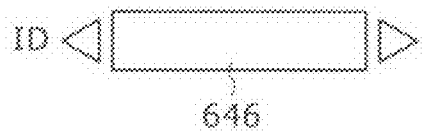
ID 646
FIG.10D
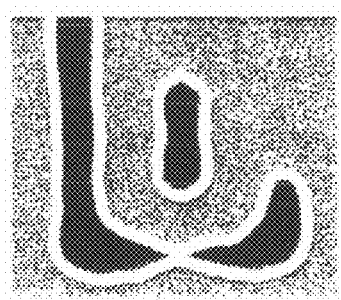
642
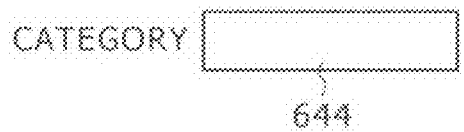
CATEGORY 644

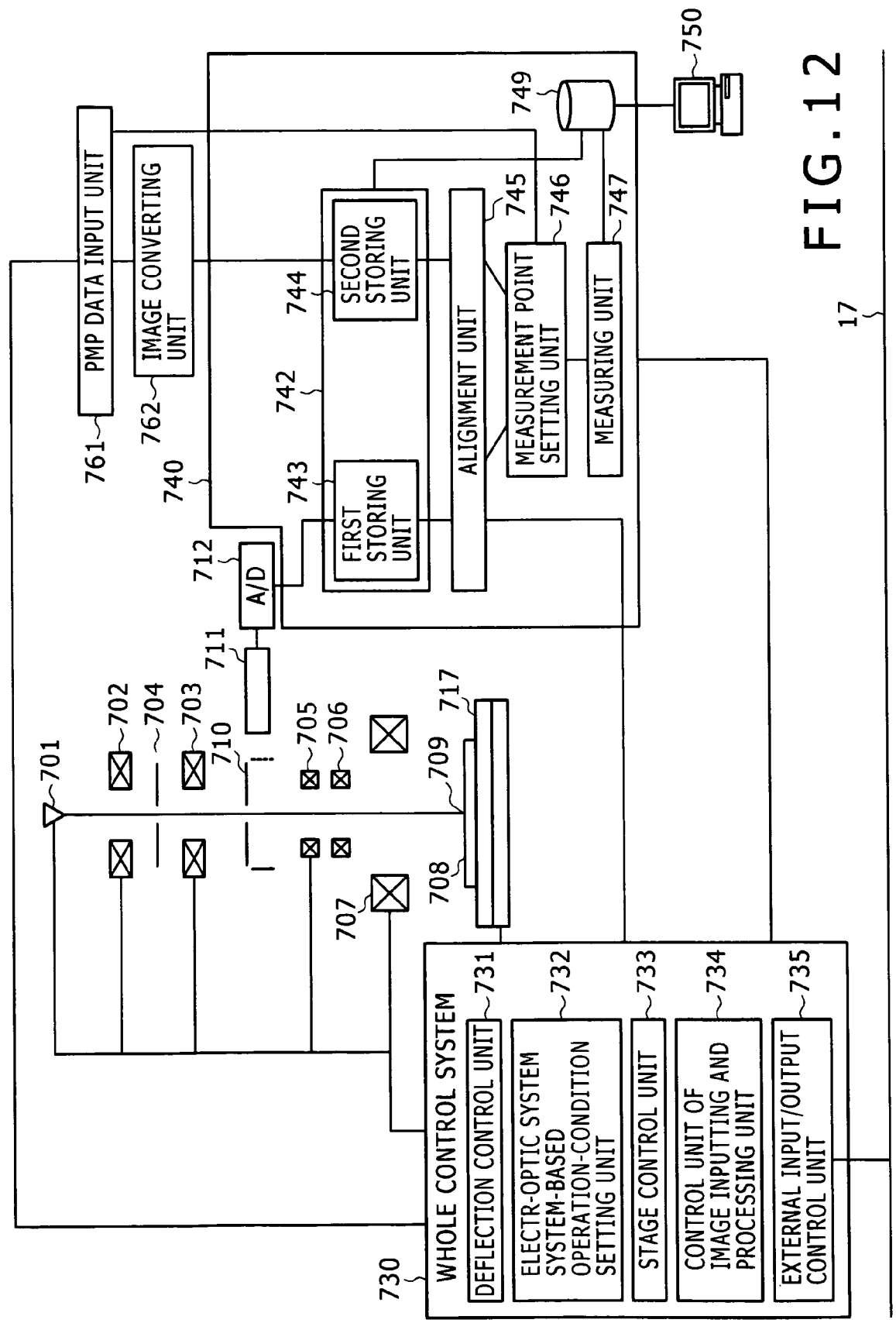

APPARATUS AND METHOD FOR MONITORING SEMICONDUCTOR DEVICE MANUFACTURING PROCESS

CLAIM OF PRIORITY

The present application claims priority from Japanese Patent Application JP 2008-050078 filed on Feb. 29, 2008, the content of which is hereby incorporated by reference into this application.

BACKGROUND OF THE INVENTION

1. Field of the Invention

The present invention relates to a system and method which use a scanning electron microscope (hereinafter, referred to as a "SEM") to irradiate a convergent beam of electrons onto a semiconductor and detect electrons emitted from the irradiated position during a pre-process for manufacturing an industrial product, in particular, a semiconductor, thereby acquiring an image of an observation object. In particular, the present invention relates to a system and method for monitoring manufacturing processes which have at least one of a SEM-based semiconductor-wafer inspecting device and a SEM-based semiconductor pattern measuring device which require acquiring a highly magnified image.

2. Description of the Related Art

With the miniaturization of semiconductors, it has been becoming more difficult to control pre-processes of semiconductors. Therefore, it has become difficult to ignore a difference between a dimension of a design pattern and a dimension of a pattern obtained by transferring a pattern to a resist, the difference being causable by an optical proximity effect in an exposure process of a semiconductor. For this reason, an optical proximity correction (hereinafter, refereed to as an "OPC") is being performed to simulate such an optical proximity effect and correct a mask pattern. In an exposure process using a mask undergone an OPC, hotspots in which defects can easily occur due to a change in a process may be generated. In order to perform a normal manufacturing process without being influenced even by a slight change in a process even if there is the hotspot, a mask layout design should be changed. Design methods for controlling defects causable in manufacturing are known as design for manufacturing (referred to as "DFM"). In order to effectively perform a DMF, it is required a system for smoothly feeding a manufactured state back to a design.

A first exemplary technique of the DMFs is a method in which CAD (computer aided design) data are analyzed to automatically determine points for managing a state of a manufacturing process and images of the points are acquired and observed by use of a microscope such as a SEM, as disclosed in, for example, JP-A-2002-33365.

A second exemplary technique of the DMFs is a method in which detected defects are acquired by inspecting an entire surface or a part of a wafer and are observed at a high magnification by use of a microscope such as a SEM, as disclosed in JP-A-H1 (1998)-135288, and a manufactured state is controlled.

A third exemplary technique of the DMFs is a method in which an image of a semiconductor wafer is acquired, edges of the image are detected, and the edges are compared with designed data, so as to detect systematic defects repeatedly occurring every shot, as disclosed in JP-A-2005-277395. Systematic defects cannot be coped with by a conventional shot comparison.

However, it is difficult to exactly monitor a manufacturing process state of a semiconductor wafer by the above-mentioned general techniques.

In the first exemplary technique in which CAD data are analyzed to automatically determine points for managing a state of a manufacturing process, growth in pattern density of a semiconductor and growth in the size of semiconductor wafers from 200 mm to 300 mm increase the number of management points which should be evaluated, and make exhaustive managing more difficult. For this reason, samples to be evaluated are selected from wafers or chips so as to reduce the number of objects to be evaluated. However, a technique of maximizing an effect with the minimum number of samples has not been established yet. Moreover, a simulation of hotspots based on a lithographic simulation cannot necessarily hinge on all of manufacturing process conditions. For this reason, some omissions can occur in evaluating only hotspots.

Further, in reviewing defects by use of a reviewing apparatus based on the second exemplary technique, it is difficult to review notable defects. Manufacture information important in performing a DMF represents whether a hypothesis made during designing and used for a simulation corresponds to a result obtained by inspection and measurement during actual manufacturing. However, it is difficult to feed defects, such as random foreign materials, which are not closely related to a design, back to the design only by reviewing the defects.

In inspection through comparison between edges and CAD data according to the third exemplary technique, it is difficult to obtain a sufficient throughput. Moreover, it is difficult to inspect the whole chips since edges of an image actually acquired do not necessarily correspond to CAD data.

SUMMARY OF THE INVENTION

It is an object of the present invention to provide a system and method for monitoring manufacturing processes making it possible that a hotspot searching apparatus (a process monitoring point searching apparatus) including a SEM apparatus extracts plural circuit pattern parts having a narrow manufacturing process margin (for example, narrow process windows) from, for example, a DFM wafer and determines them as process monitoring points in a short time, and a process monitoring point monitoring apparatus including, for example, a CD-SEM apparatus performs at least one of shape inspection and shape length measurement on the determined process monitoring points under high resolution in detail.

In order words, the present invention is a system for monitoring a manufacturing process including a hotspot searching apparatus (a process monitoring point searching apparatus) composed of an SEM apparatus (also including a hotspot monitoring apparatus composed of, for example, a review SEM apparatus) that manufactures a small number of chips or regions (shots) on a semiconductor wafer under respectively different manufacturing process conditions (exposure conditions), compares SEM images of their external appearances to output a point having large differences as a narrow process window, that is, a process monitoring point that should be managed in mass production, the narrow process window having a narrow manufacturing process condition (exposure condition) in the manufacturing of the semiconductor wafer, and sets the point as a measurement point, for example, by a length measurement SEM (CD-SEM) apparatus.

According to another aspect of the present invention, there is provided a manufacturing process monitoring system including: a hotspot searching apparatus (including a hotspot monitoring apparatus composed of a review SEM) composed of an SEM apparatus which acquires SEM images for every region from a semiconductor wafer having plural regions where circuit patterns have been formed under different manufacturing process conditions, compares the acquired SEM images for every region to obtain differences, extracts points (points having large differences) where the obtained differences exceed a reference value as process monitoring point candidates, and narrows-down the extracted process monitoring point candidates, so as to search for process monitoring points; and a process monitoring point monitoring apparatus that images the images of the process monitoring points on the basis of the process monitoring points having been searched by the hotspot searching apparatus and evaluates the shapes or dimensions of circuit patterns of the process monitoring points on the basis of the imaged images, in a region on a semiconductor wafer different from the semiconductor wafer on which the processing monitoring points have been searched or a region different from the region on the semiconductor wafer.

According to a further aspect of the present invention, there is provided a manufacturing process monitoring system including: a SEM image acquiring unit for acquiring SEM images of a sample by imaging the sample; a process monitoring point searching unit that processes SEM images obtained by imaging, as the sample, a first semiconductor wafer whose surface is formed with patterns by the SEM image acquiring unit and searches for regions for monitoring a process of forming the patterns; and a process monitoring point monitoring unit that evaluates shapes or dimensions of patterns formed on a second semiconductor wafer from SEM images obtained by imaging a second semiconductor wafer by the SEM image acquiring unit on the basis of information on regions for monitoring the process having been searched by the process monitoring point searching unit, wherein the process monitoring point searching unit processes the SEM images of every region obtained by imaging the first semiconductor wafer having the plurality regions on which the patterns have been formed by the SEM image acquiring unit under different process conditions and searches for regions for monitoring the process.

According to a still further aspect of the present invention, there is provided a manufacturing process monitoring method including: imaging, as a sample, a first semiconductor wafer whose surface is formed with patterns by an SEM image acquiring unit and acquiring the SEM image of the first semiconductor wafer; processing the acquired SEM images of the first semiconductor wafer to search for regions for monitoring a process of forming the patterns; imaging a second semiconductor wafer by the SEM image acquiring unit, on the basis of information on the searched regions for monitoring the process; and processing the SEM images of the regions for monitoring the process obtained by imaging the second semiconductor wafer and evaluating shapes or dimensions of patterns formed on the second semiconductor wafer, wherein the searching for the regions for monitoring the process processes the SEM images of every region obtained by imaging the first semiconductor wafer having the plurality regions on which the patterns have been formed by the SEM image acquiring unit under different process conditions and searches for regions for monitoring the process.

According to exemplary embodiments of the present invention, it is possible that a hotspot searching apparatus (a process monitoring point searching apparatus) including a SEM apparatus extracts plural circuit pattern parts having a narrow manufacturing process margin (for example, narrow process windows) from, for example, a DFM wafer and determines them as process monitoring points in a short time, and a process monitoring point monitoring apparatus including, for example, a CD-SEM apparatus performs at least one of shape inspection and shape length measurement on the determined process monitoring points under high resolution in detail.

These and other objects, features and advantages of the invention will be apparent from the following more particular description of preferred embodiments of the invention, as illustrated in the accompanying drawings.

BRIEF DESCRIPTION OF THE DRAWINGS

FIG. 3 is a schematic diagram illustrating the configuration of a manufacturing process monitoring system according to a first embodiment of the present invention;

FIG. 7 is a diagram illustrating an example of extraction parameters which a hotspot searching apparatus extracts as a candidate for points greatly influenced by a change in a process;

FIG. 8A is a diagram illustrating a pattern shape formed under a condition of a center of a process window;

FIG. 8B is a diagram illustrating a pattern shape formed under a condition of a boundary part of a process window;

FIG. 10A is a diagram illustrating an example of a GUI displaying a position of a chip of a wafer from which a SEM image has been acquired;

FIG. 10B is a diagram illustrating an example of a GUI displaying design data corresponding to a pattern of which a SEM image has been acquired, and an ID thereof;

FIG. 10C is a diagram illustrating an example of a GUI displaying design data of a shot region;

FIG. 10D is a diagram illustrating an example of a GUI displaying a SEM image of a processing monitoring candidate pattern and a classification category thereof;

FIG. 12 is a diagram illustrating an example of a configuration of a process monitoring point (PMP) monitoring apparatus (evaluating apparatus) using a CD-SEM as an image acquiring unit;

DETAILED DESCRIPTION OF THE PREFERRED EMBODIMENTS

Hereinafter, a system and method of monitoring semiconductor manufacturing processes exemplary embodiments of the present invention will be described with reference to FIGS. 1 to 14.

When a semiconductor wafer is exposed to light to form hyperfine circuit pattern, it is required to add a pattern for correction to a graphic corner part on a mask pattern in consideration of light diffraction phenomenon and so on. In such a mask pattern, a part where a defect can be easily generated by a change in a process and a point where a defect cannot be easily generated by a change in a process are generated at the same pattern pitch.

Such a point where a defect can be easily generated is referred to as a hotspot, and a position which is easily influenced by a change in a process can be specified on design data by a lithographic simulation, etc. With a tendency to reduce a pattern pitch, a process condition under which a normal pattern is formed results in a small margin, which remarkably increases the number of inspection regions which should be managed.

Figure 1:
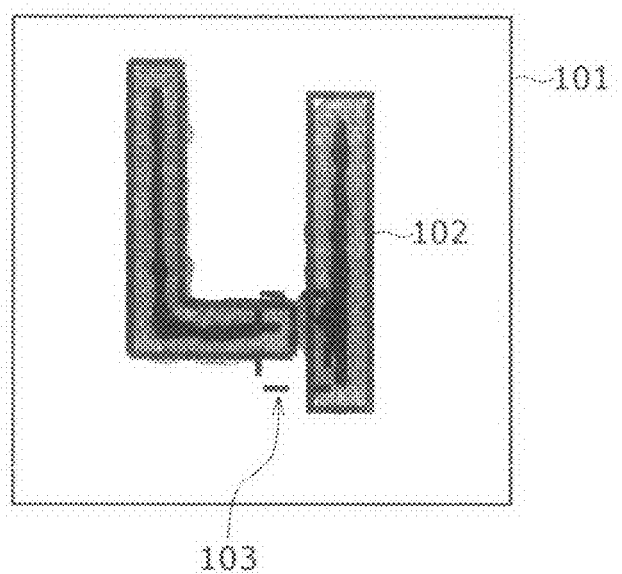
FIG. 1 is a diagram illustrating an example of a process monitoring point inspected and observed in detail.

Inspection corresponding to such a hotspot includes acquiring a high-powered SEM image by use of a CD-SEM apparatus, etc., measuring a width between patterns on the basis of the acquired high-powered SEM image, and so on. FIG. 1 shows an example of a SEM image of a region including a hotspot. Reference numeral 101 represents a SEM image, reference numeral 102 represents design data, and a circuit pattern formed on a wafer is generally shown in a combination of rectangular patterns. Reference numeral 103 represents an inspection region which should be observed, and is a point of a hotspot which is easily influenced by a change of a process during exposure. In a CD-SEM apparatus, etc., the SEM image and CAD data are compared with respect to a region having a small process margin and a deformation in the shape of the region is measured. However, all regions which are easily influenced by a change of a process are not necessarily extracted by a lithographic simulation. One of the reasons is a mask manufacturing error or a physical parameter disagreement between a simulation and an actual exposure apparatus. For example, in the case of manufacture using a mask, a lithographic simulation is not necessarily a simulation reflecting a manufacture error of the mask, and a complete physical parameter agreement between the simulation and an exposure apparatus. Moreover, all critical hotspots may not be extracted and output in the lithographic simulation.

First Embodiment

Figure 2A:
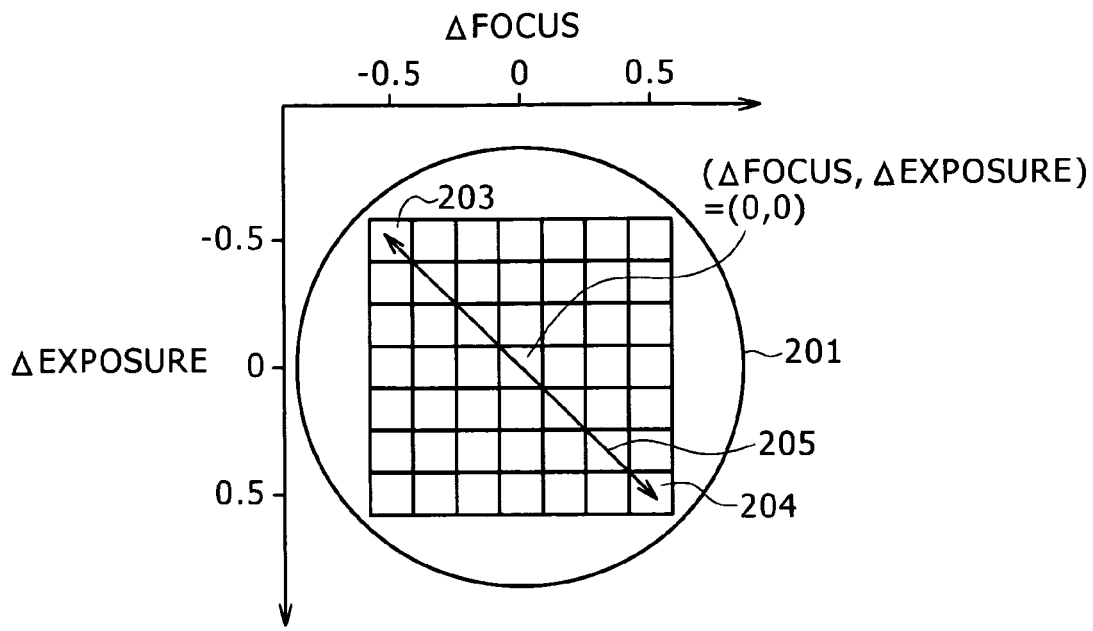
FIG. 2A is a diagram illustrating the relationship between a focus and exposure amount for each chip on a FEM (focus exposure matrix) wafer.
Figure 2B:
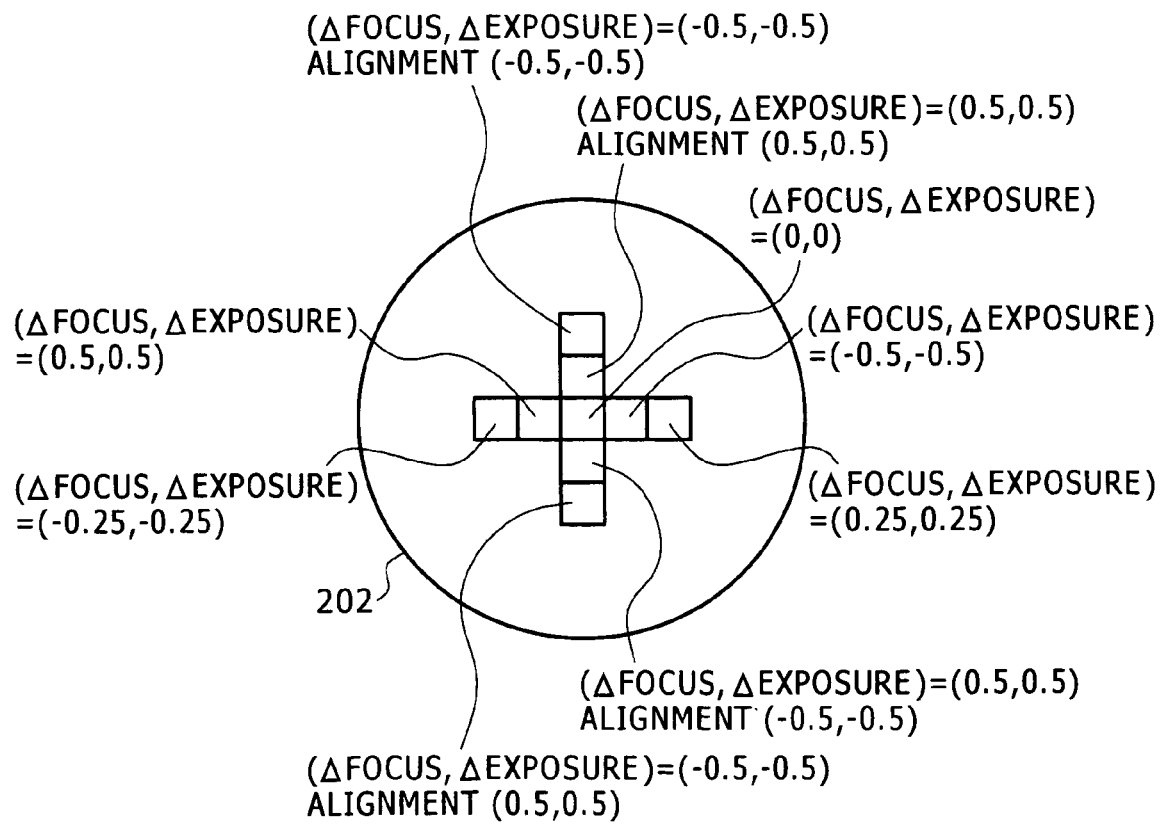
FIG. 2B is a diagram illustrating a wafer on which exposure has been performed while an exposure condition is changed between neighboring shot regions in order to search for regions easily influenced by a change in a process.
Figure 4:
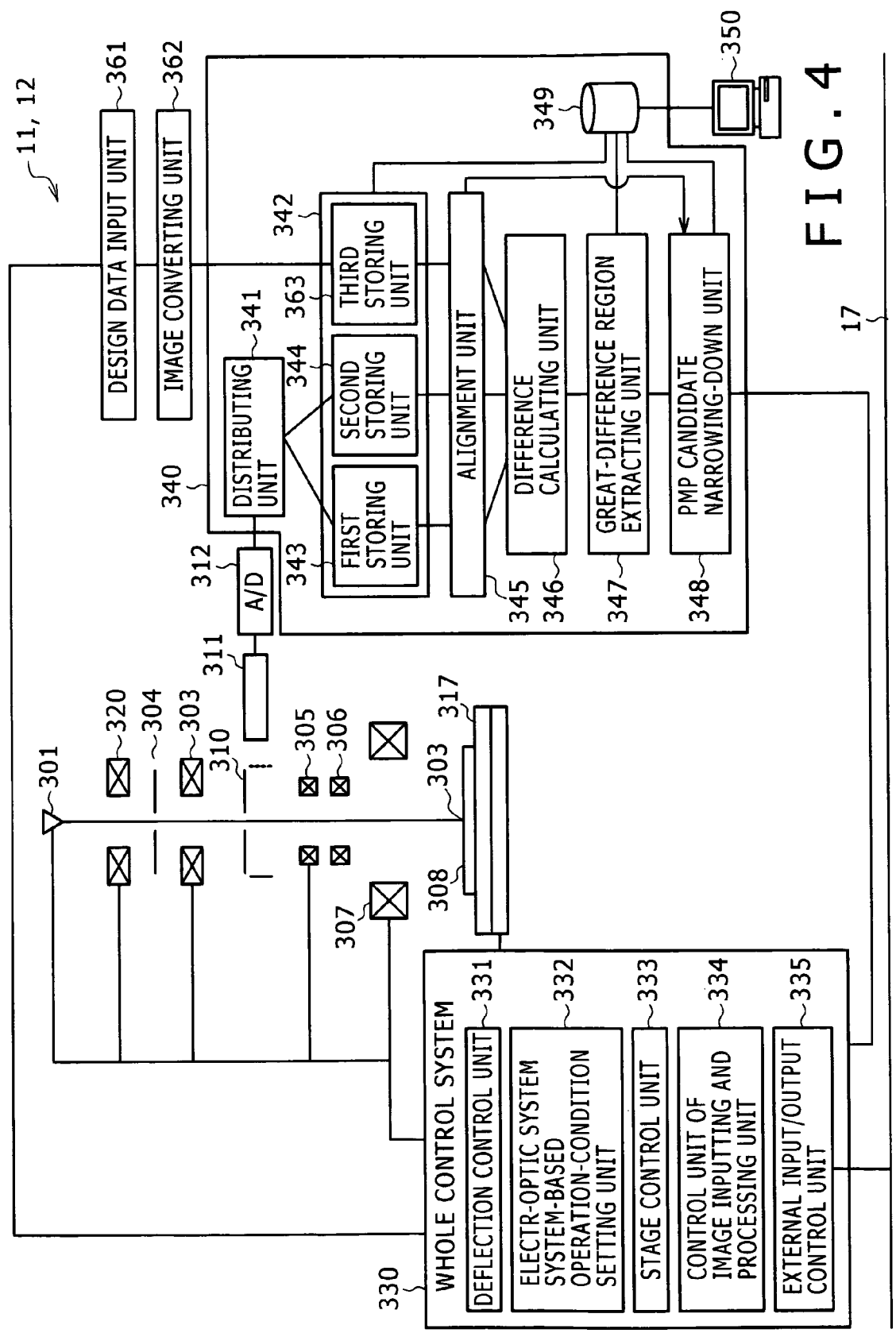
FIG. 4 is a diagram illustrating the configuration of an example of a hotspot searching apparatus (searcher)

An exemplary embodiment of the present invention provides a technique of determining a relatively large region or a region of a chip easily influenced by a change in a process, that is, a hotspot (a process monitoring point measurable by a CD-SEM apparatus, etc.) by use of, for example, a hotspot searching apparatus (a process monitoring point searching apparatus) 11 composed of a SEM apparatus and so on as shown in FIG. 4. FIGS. 2A and 2B show an example of a wafer on which the process monitoring point searching apparatus 11, and a computer 12 according to the exemplary embodiment searches (extracts) a region easily influenced by a change in a process.

In FIG. 2A, reference numeral 201 represents a FEM (focus exposure matrix) wafer, and when a pattern is transferred to a resist, a focus value and an exposure amount (exposure dose) are changed with respect to each shot (each region irradiated in once exposure). The pattern transferred to the resist is deformed when the focus value and the exposure amount are changed, and a point where the deformation amount is large becomes a point of a hotspot easily influenced by a change in a process (a candidate for a process monitoring point to be measured by a CD-SEM apparatus, etc.). The FEM wafer 201 is a wafer on which a circuit pattern has been formed thereon by subsequently changing the focus value and the exposure amount. The FEM wafer may include a wafer on which a circuit pattern has been formed by changing a relative location between masks using multiple exposures.

In the hotspot searching apparatus (a process monitoring point searching apparatus) 11 composed of, for example, a SEM apparatus, SEM images of different shots having the same circuit pattern portion on the FEM wafer 201 can be acquired and compared so as to extract a region which has a pattern having been deformed due to a change in a process (the focus value and the exposure amount). However, in order to extract only a point where an amount of deformation of the circuit pattern portion is large, the above-mentioned manner is acceptable. However, there are cases in which it is difficult to extract a circuit pattern easily influenced by a change in a process by comparing SEM images of circuit patterns having the subtle difference in the structural state. In such a case, it is required to compare SEM images of shots which are comparatively greatly different from each other in the exposure amount and the focus so as to make a circuit pattern deformation part apparent.

In order to perform an image process on the SEM images of the shots for which focuses are deviated from each other, a method of moving the stage holding the wafer, acquiring SEM images deviated by an integral multiple of a shot, and performing comparison is used. In this case, an alignment process between two images or an image buffering capability is reduced as the distance between the SEM images compared is reduced, which makes it possible to improve the throughput. Further, if a wafer is formed such that a comparatively great change in the focus value and the exposure amount (exposure dose) is generated between neighboring shots as the wafer 202 shown in FIG. 2B, it is possible to increase the deformation amount of the circuit pattern.

For example, FEM wafers are manufactured such that a change is generated by 0.25 times or more of a permissible range for manufacturing non-defective products calculated in advance by the lithographic simulator 14 shown in FIG. 3, that is, a process window. If a deviation of 0.25 times or more exists, searching in the range of the process window becomes possible through searching five shots by the process monitoring point searching apparatus 11, and a computer 12. Further, in order to specify the points easily influenced by a change in a process by the process monitoring point searching apparatus 11, and the computer 12, a quite small pixel size is required. Therefore, if, for example, five-shot searching is completed as described above, it becomes possible to search hotspots (candidates for process monitoring points) through a practical searching, for example, searching for several hours.

Further, if a wafer 202 is manufactured such that the focus and the exposure amount are changed together in an X direction or a Y direction as shown in FIG. 2B, it becomes easier to expose hotspots. In double exposure recently applied, if the relative positions of masks for individual are set to be different in a primary exposure and as secondary exposure, hotspots which are patterns easily influenced by misalignment can be extracted.

Furthermore, the hotspot searching apparatus (a process monitoring point searching apparatus) 11, and the computer 12 according to an exemplary embodiment of the present invention can make shots compared in not only a special wafer but also a general FEM wafer proper although throughput is reduced.

A hotspot searching apparatus according to an exemplary embodiment of the present invention uses a wafer having circuit patterns formed from shots (areas) of the above-mentioned various manufacturing process conditions to make it possible to determine process monitoring points PMP (points easily influenced by a change in a process) which the process monitoring point monitoring apparatus 16 such as a CD-SEM will measure.

Next, a system for monitoring manufacturing processes according to a first embodiment of the present invention will be described with respect to FIG. 3. The system for monitoring manufacturing processes according to the first embodiment of the present invention includes a hotspot searching apparatus (a process monitoring point searching apparatus) 11, a computer 12 (350), a design data server 13, a lithographic simulator 14, a PMP managing apparatus 15, and a PMP monitoring apparatus 16, which perform data communication with one another through a network 17. The hotspot searching apparatus (a process monitoring point searching apparatus) 11 is composed of a SEM by which the present invention is characterized, and extracts a process monitoring point (hereinafter, referred to as a "PMP"). The computer 12 (350) includes a GUI (graphic user interface), displays SEM images acquired by the hotspot searching apparatus 11, and includes an input unit for permitting a user to perform addition of a code of a category and so on. The design data server 13 provides design data to the hotspot searching apparatus 11. The lithographic simulator 14 extracts a point where a shape is largely deformed by a change in a process through a simulation. The PMP managing apparatus 15 merges the coordinates of a PMP output from the computer 12 and the coordinates of the PMP obtained through a lithographic simulation and output from the lithographic simulator 14, thereby determining a final PMP. The PMP monitoring apparatus 16 is composed of a measuring apparatus having a CD-SEM which acquires an image of the PMP output from the PMP managing apparatus 15 and performs at least one of shape inspection and shape length measurement, a SIM (scanning ion microscope) using an ion beam source as a light source, an AFM (atomic force microscope), etc. According to this exemplary embodiment of the present invention, the hotspot searching apparatus 11 and the computer 12 (350) may function as a hotspot searching apparatus.

Next, an example of the hotspot searching apparatus (PMP searching apparatus) according to the exemplary embodiment of the present invention will be described with reference to FIG. 4. An electro-optic system of the hotspot searching apparatus 11, 12 includes an electron gun 301 for emitting an electron beam, two condenser lenses 302 and 303 for condensing the electron beam, deflectors 305 and 306 for deflecting the electron beam, an objective lens 307, an ExB 310 for deflecting secondary electrons and/or reflected electrons generated from a semiconductor wafer 308, and an electron detector 311 for detecting the secondary electrons and/or reflected electrons deflected by the ExB 310.

A SEM image signal output from the electron detector 311 is converted into a digital image signal by an A/D converter 312. The digital image signal is input to an image processing unit 340 and is stored in a storing unit 342 through a distributing unit 341. In the storing unit 342, at least two regions for storing image signals detected from two shots which are subjected to an image comparison, for example, a first storing unit 343 and a second storing unit 344 are set, and image signals are distributed to the regions by the distributing unit 341.

A case in which a reference SEM image of a shot is stored in a region (for example, the first storing unit) 343 and an inspection SEM image of a shot is stored in another region (for example, the second storing unit) 344 will be described below. The distributing unit 341 has at least two modes. In one of the modes, SEM images are acquired from shots separated from each other by a predetermined distance, for example, neighboring shots, are stored in the first storing unit 343 and the second storing unit 344, and are compared with each other. In this mode, one SEM image, for example, a SEM image acquired from a first shot, which imaging starts from, is used as a reference SEM image.

Reference numeral 317 represents an XY stage which includes a measuring instrument for measuring the position of the XY stage, for example, a laser measuring instrument. The position of the stage measured by the XY stage 317 is input to a deflection control unit 331. The electron gun 301 emits an electron beam. The condenser lenses 302 and 303 condense the electron beam. The deflectors 305 and 306 deflect the electron beam in a direction perpendicular to the moving direction of the XY stage 317 so as to scan a wafer 308 with the electron beam. Therefore, the electron detector 311 detects SEM images from individual shots on the wafer 308, the distributing unit 341 distributes the SEM images, and the storing unit 342 stores the SEM images as two-dimensional SEM images.

The deflection control unit 331 finely controls the deflectors 305 and 306 such that images having the same pixel size can be acquired even though the moving speed of the XY stage is changed when the XY stage 317 is in motion. In the other mode, when the XY stage 317 is in resting state, the deflectors 305 and 306 performs scanning two-dimensionally with respect to a field of view so as to acquire two-dimensional images.

An alignment unit 345 performs alignment on the basis of a position alignment technique of a peak of the normalized correlation between the output images, or the minimum of the sum of squares of the difference between two images, or the absolute value of the difference.

A difference calculating unit 346 compares SEM images having the same pattern on the basis of the result of the alignment and calculates the difference between the SEM images. Further, the difference calculating unit 346 may output SEM image characteristics including not only the difference but also the size, brightness, and texture of a region where the difference has occurs, the sum of brightness difference, etc. Furthermore, instead of calculating the difference between SEM images, the difference calculating unit 346 may extract edge portions of patterns from two SEM images and calculate a change in the edge position as a difference. Patterns which the difference calculating unit 346 compares may be neighboring patterns shown in FIG. 2A or FIG. 2B. As an exposure amount of an exposure apparatus increases, a line width decreases. Therefore, if shots which are expected to have a largest change in the shape, for example, a shot corresponding to a minimum of the allowable range of the exposure amount and a shot corresponding to a maximum of the allowable range of the exposure amount are compared, it is possible to obtain a large change.

Moreover, a modified example of the difference calculating unit 346 may use a method of comparing a more number of shots at the same time. The reason for this is that, since a circuit pattern may be not deformed on the basis of a focus value or exposure amount of an exposure instrument due to an increase in complexity of an OPC pattern used for forming a circuit pattern, it is not necessarily expectable which manufacturing process condition should be changed to maximize a deformation in a circuit pattern. In this case, pattern edges of individual shots may be calculated with reference to a reference shot and a difference may be calculated on the basis of a calculated maximum amount of a deformation in the pattern as shown in FIG. 5.

Figure 5:
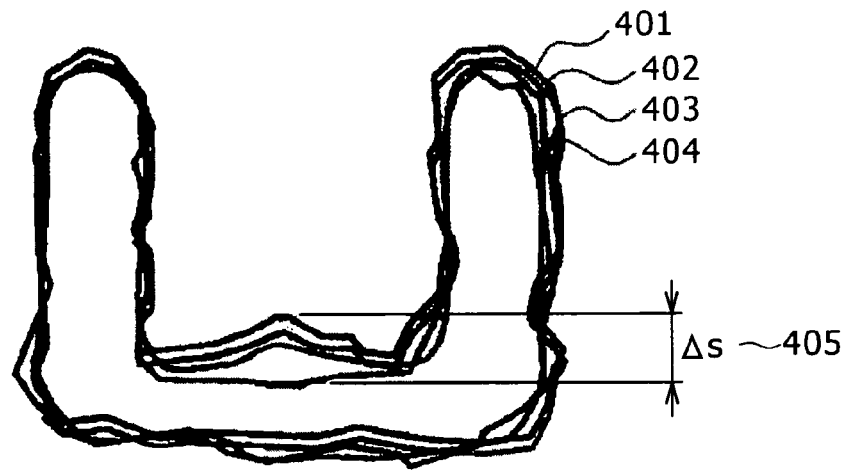
FIG. 5 is a diagram illustrating an overlapped state of edge patterns extracted from SEM images of patterns which should be formed in the same shape in regions formed in four different shots.

In FIG. 5, reference numerals 401 to 404 represent edges of a pattern which are extracted from SEM images of four different shots and are aligned by the alignment unit 345. In FIG. 5, a maximum difference $\Delta S$ (405) between the shots is obtained. A great-difference region extracting unit 347 may compare a point in which the maximum difference $\Delta S$ is obtained with a predetermined extraction parameter (predetermined reference value) to extract the point as a hotspot easily influenced by a change in a process.

Moreover, the difference calculating unit 346 may use a method of using, as a reference SEM image, a SEM image obtained from a shot where a pattern has been formed under a condition of a process window center under which a most normal circuit pattern is expected to be formed, and comparing the reference SEM image with an extraction SEM image obtained from another shot. This method is particularly useful in the case of using a normal FEM wafer. In a normal FEM wafer, a difference in a manufacturing process condition between neighboring shots is subtle. Therefore, first, the hotspot searching apparatus 11, 12 may acquire, as a reference SEM image, a SEM image of a shot in which the central part of a FEM wafer is determined as the center of a process window through a lithographic simulation of the lithographic simulator 14, move the field of view to a position of a shot which is an extraction object, and then acquire an extraction SEM image of the shot. Then, the difference calculating unit 346 may compare the acquired reference SEM image and extraction SEM image.

Figure 6:
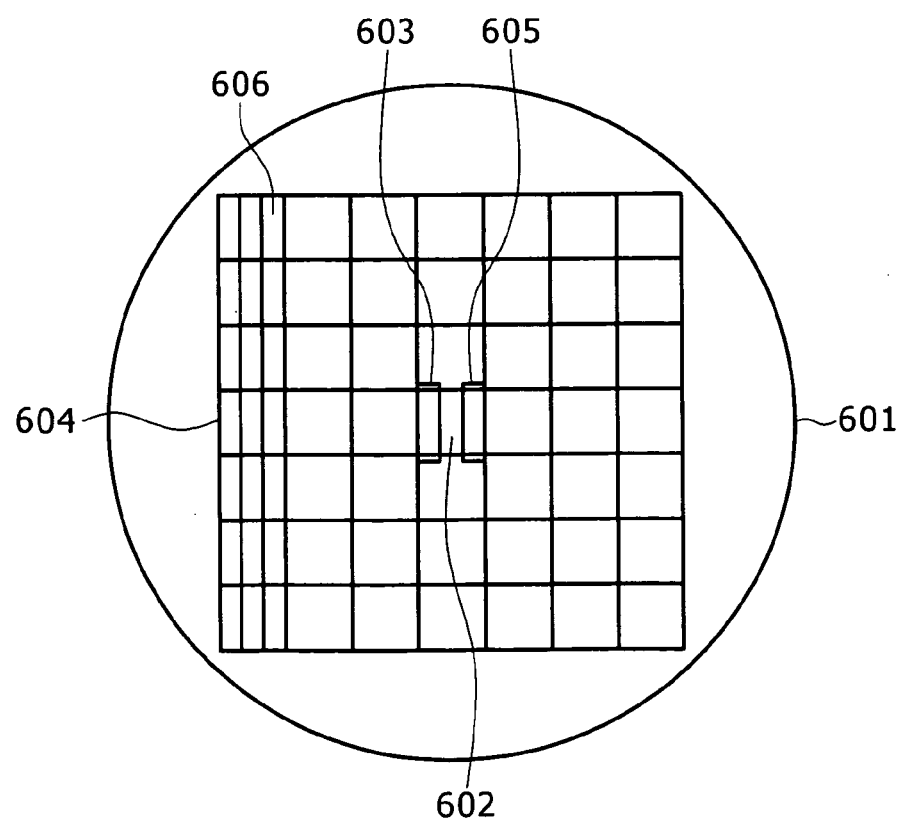
FIG. 6 is a diagram illustrating regions from which a hotspot searching apparatus sequentially acquires SEM images on the basis of information on an FEM wafer through a lithographic simulation.

This is described with reference to FIG. 6. In FIG. 6, reference numeral 601 represents a wafer having been manufactured by applying different process conditions to individual shots. Reference numeral 602 represents a shot having been manufactured under a condition of a center of a process window. The hotspot searching apparatus 11 having a configuration shown in FIG. 4 acquires a SEM image of a region 603 while moving the XY stage 317 on the basis of a command from a whole control system 330 according to information of the FEM wafer obtained from the lithographic simulator 14 through a lithographic simulation. The distributing unit 341 performs distribution of the SEM image and the SEM image is stored in the first storing unit 343 as a reference SEM image.

Next, the hotspot searching apparatus 11 moves a field of view to a shot of a manufacturing process condition to be extracted, on the basis of a command from the whole control system 330 and acquires an extraction SEM image denoted by a reference numeral 604. The distributing unit 341 classifies the extraction SEM image into an inspection SEM image and the extraction SEM image is stored in the second storing unit 344. The difference calculating unit 346 compares the extraction SEM image with the reference SEM image of the region 603 to perform a shape comparison, and the great-difference region extracting unit 347 extracts a point where an amount of deformation is great. Then, the hotspot searching apparatus 11, 12 acquires a reference SEM image of a region 605 and an extraction SEM image of a region 606 while moving the field of view on the wafer 601 again. The difference calculating unit 346 compares the reference SEM image of the region 605 and the extraction SEM image of the region 606, and the great-difference region extracting unit 347 extracts a point where an amount of deformation is large. This method is applicable to a normal FEM wafer and does not require that a shot of a center of a process window is a center of a wafer or that neighboring shots are manufactured under a subsequently varying manufacturing process condition.

In a secondary storing apparatus 349, there is set an extraction parameter which is used for the great-difference region extracting unit 347 to extract, from every pattern portion, a candidate for a point strongly influenced by a change in a process which is a great-difference region. When a difference output from the difference calculating unit 346 is larger than the extraction parameter stored in the secondary storing apparatus 349, the great-difference region extracting unit 347 extracts a point as a candidate for a point strongly influenced by a change in a process (PMP). Further, when a feature quantity of a SEM image of a difference is input from the difference calculating unit 346, the feature quantity of the SEM image of the difference may be used to extract a candidate for a point strongly influenced by a change in a process. The secondary storing apparatus 349 is configured to receive a SEM image stored in any one part of the storing unit 342 and store the SEM image. Moreover, the secondary storing apparatus may store the coordinates of a candidate for a point strongly influenced by a change in a process which is extracted by the great-difference region extracting unit 347 or a feature quantity of a SEM image of a difference which is output by the difference calculating unit 346.

A GUI terminal 350 displays, on a wafer map, the extracted candidate for a point strongly influenced by a change in a process (at least one of the coordinates of the candidate, a SEM image of the candidate (including the feature quantity), and an image which is obtained by converting design data of the candidate by the image converting unit 362 and is stored in the third storing unit 363). The whole control system 330 includes an electro-optic system-based operation-condition setting unit 332, a stage control unit 333, a control unit 334 on an image inputting and processing unit, and an external input/output control unit 335 which controls outputting of the coordinates of an extracted point strongly influenced by a change in a process or an image of the point through the network 17, etc. Reference numeral 304 represents aperture stops. The condenser lenses 302 and 303 are controlled to control an amount of primary electrons which rebound from the aperture stops 304, which makes it possible to change a probe current.

A design data inputting unit 361 inputs design data to an image converting unit 362, and the image converting unit 362 converts the design data into design images. The design images are stored in a third storing unit 363. The distributing unit 341 distributes SEM images to the first and second storing units 343 and 344, and the first and second storing units 343 and 344 store the SEM images. The great-difference region extracting unit 347 determines whether the magnitude of a difference output from the difference calculating unit 346 exceeds a reference value on the basis of an extraction parameter which corresponds to an object part of a circuit pattern and is stored in the secondary storing apparatus 349, according to a correspondence relationship between the design images and the SEM images. Moreover, the great-difference region extracting unit 347 extracts a candidate of a point strongly influenced by a change in a process. A first example of the extraction parameter stored in the secondary storing apparatus 349 is shown in FIG. 7.

A design pattern is divided into first to N-th regions on the basis of influence on performance or yield, and reference values including a threshold value of a difference brightness, a size of each region having a difference brightness exceeding the threshold value (area: Size ($nm^2$), and the sum of the difference brightness of each region Sum(max(difference−threshold value, 0)) are registered for each of the regions. The great-difference region extracting unit 347 determines which point is strongly influenced by a change in a process, on the basis of one of the reference values shown in FIG. 7 or a combination of them. An apparatus operator may set the values of the extraction parameters by use of the GUI terminal 350 (corresponding to the computer 12), and the values of the extraction parameters may be automatically set according to statistics. When the values of the extraction parameters are automatically set according to statistics, for example, a method of generating a histogram for every divided region and outputting the standard deviation thereof may be used.

A PMP candidate narrowing-down unit 348 is required not to extract a point corresponding an insignificant region where a pattern having considering a pattern change in advance, such as a line end, or a dummy pattern has been formed, as a point strongly influenced by a change in a process. Examples of the insignificant region include (1) a region where a pattern meaningless in view of an electric circuit, such as a dummy pattern, has been formed, and (2) a region where a pattern has been formed in consideration of a pattern change. Examples of a pattern corresponding to (2) are shown in FIGS. 8A and 8B.

Reference numeral 621 shown in FIG. 8A represents a pattern having been formed in the center of a process window, and reference numeral 622 shown in FIG. 8B represents a pattern having been formed in the vicinity of a boundary of a process window. Reference numeral 623 represents a pattern end. Such a portion is comparatively greatly changed in dimensions due to a change in a process, and thus is generally designed such that a change in dimensions does not matter.

Meanwhile, a neck portion denoted by reference numeral 804 is in a state immediately before opening and easily causes a defect according to some changes. Further, it is effective to mask points of a circuit pattern to be formed, which does not influence performance even though it is deformed, and to extract only critical points for the performance by the hotspot searching apparatus 11, 12. However, even in the case of a pattern end as denoted by reference numeral 623, it is clear that, when an amount of deformation exceeds a permissible limit, the performance is influenced.

In order to make the hotspot searching apparatus 11, 12 more sensitive, for every position of a circuit pattern, a parameter regarding the difference stored in the secondary storing apparatus 349, that is, a permissible value of a difference brightness or the size of a point having a difference bright exceeding a permissible value may be changed. The parameter may be determined on the basis of a pattern width or neighboring patterns in an inspected layer or may be determined on the basis of the relationship between an inspected layer and a circuit pattern in a lower or upper layer thereof.

As described above, when a divided region as shown in FIG. 7 is not a significant region, the PMP candidate narrowing-down unit 348 excludes the corresponding region from great-difference regions by remarkably increasing the reference value for the corresponding region, thereby having the usual effects of masking the corresponding region. After the great-difference region extracting unit 347 extracts great-difference regions, the PMP candidate narrowing-down unit 348 may mask an insignificant region on the basis of alignment information obtained from the alignment unit 345 so as to exclude the insignificant region. Examples of the insignificant region includes a region determined to be rarely influenced by a change in a process on the basis of a result of a lithographic simulation obtained from the lithographic simulator 14 or design data obtained from the design data server 13, a region having no affect on circuit functions even though it is influenced by a change in a process, etc.

As described above, if the hotspot searching apparatus 11, 12 according to this exemplary embodiment of the present invention searches for a great-difference region on a FEM wafer by a lithographic simulation shown in FIG. 3, it can extract a PMP candidate in which a pattern shape is greatly changed according to a change in a process condition. In a case of using the wafer 201, in order to extract a great-difference region in which a pattern shape is greatly changed by a change in a process, it may be required to compare shots separated from each other by plural shots to extract a great-difference region. For example, it may be required to compare a shot 203 with a shot 204. For this end, after an image of the shot 203 is acquired, it is required to skip over a shot 205 and to acquire an image of the shot 204, resulting in decreased throughput. Meanwhile, neighboring shots on the wafer 202 are greatly different in process conditions and thus a deformation of a pattern shape is easily generated therebetween. Therefore, even when neighboring shots are compared, it is possible to extract a PMP candidate. Consequently, it is effective in view of throughput.

In the hotspot searching apparatus 11, 12 according to this exemplary embodiment of the present invention, in order to extract a PMP, it is necessary to set a region for acquiring an image very wide. Meanwhile, it is required to find out a change of 10% to 50% in a pattern size as a pattern size change due to a change in a process and to apply a pixel size of 5 nm to 20 nm. However, in order to acquire an SEM image of an entire shot in a short time, a comparatively large pixel size, for example, 8 nm to 20 nm or more, is required and thus a probe current of 250 pA or more for emitting a large number of secondary electrons is required. At the probe current, a diameter of an electron source used in the electron gun 301 increases such that a diameter of a beam increases. If a pixel size is 8 nm or greater, it is possible to cope with an image acquiring condition of a comparatively large current. However, in a case of a SEM image having a pixel size of 8 nm or greater, for example, it is difficult to see in detail a pattern deformation of about 3 nm required to measure of a pattern having a line width of 32 nm.

For this reason, it is preferable to acquire an image of a great-difference region extracted by the difference calculating unit 346 at a higher magnification so as to determine a point strongly influenced by a change in a process. After an image of a predetermined extraction area is acquired and a great-difference region is extracted, the whole control system 330 controls primary electrons radiated from the electron gun 301 or primary electrons rebounding from the stops 304 by controlling the condenser lenses 302 and 303 so as to reduce the probe current emitted to an extraction object (for example, the wafer 308) to about 10 pA to 100 pA. In order to acquire an image without frame addition or by a small number of frame addition times to extract a candidate from a wide range of a shot in a short time, it is generally required to emit a probe current of 100 pA or more. However, it is difficult under the above-mentioned condition to realize a beam having a small diameter due to a coulombic force or a reflection of a light source diameter of an electron source on an extraction object and thus it is required to reduce the probe current.

Next, the whole control system 330 of the hotspot searching apparatus 11, 12 performs control to move the XY stage 317 to a great-difference region extracted by the great-difference region extracting unit 347, to acquire an image of the great-difference region at a magnification higher than that when the great-difference region was extracted, and to display the image on the GUI terminal 350 (corresponding to the computer 12). The great-difference region of the GUI terminal 350 includes an unsystematic defect such as a foreign material, an indefectible element such as a grain, a change in brightness due to charging when an electron beam is radiated, etc., in addition to points greatly influenced by a change in a process. It is more preferable to make it possible for a user to select a region where a shape is greatly deformed by a change in a process from a SEM image of the great-difference region displayed on the GUI terminal 350. The coordinates of a great-difference region (PMP candidate) selected by the user and a SEM image of the great-difference region are output from the external input/output control unit 335 to the PMP managing apparatus 15 and so on, through the network 17.

Figure 9:
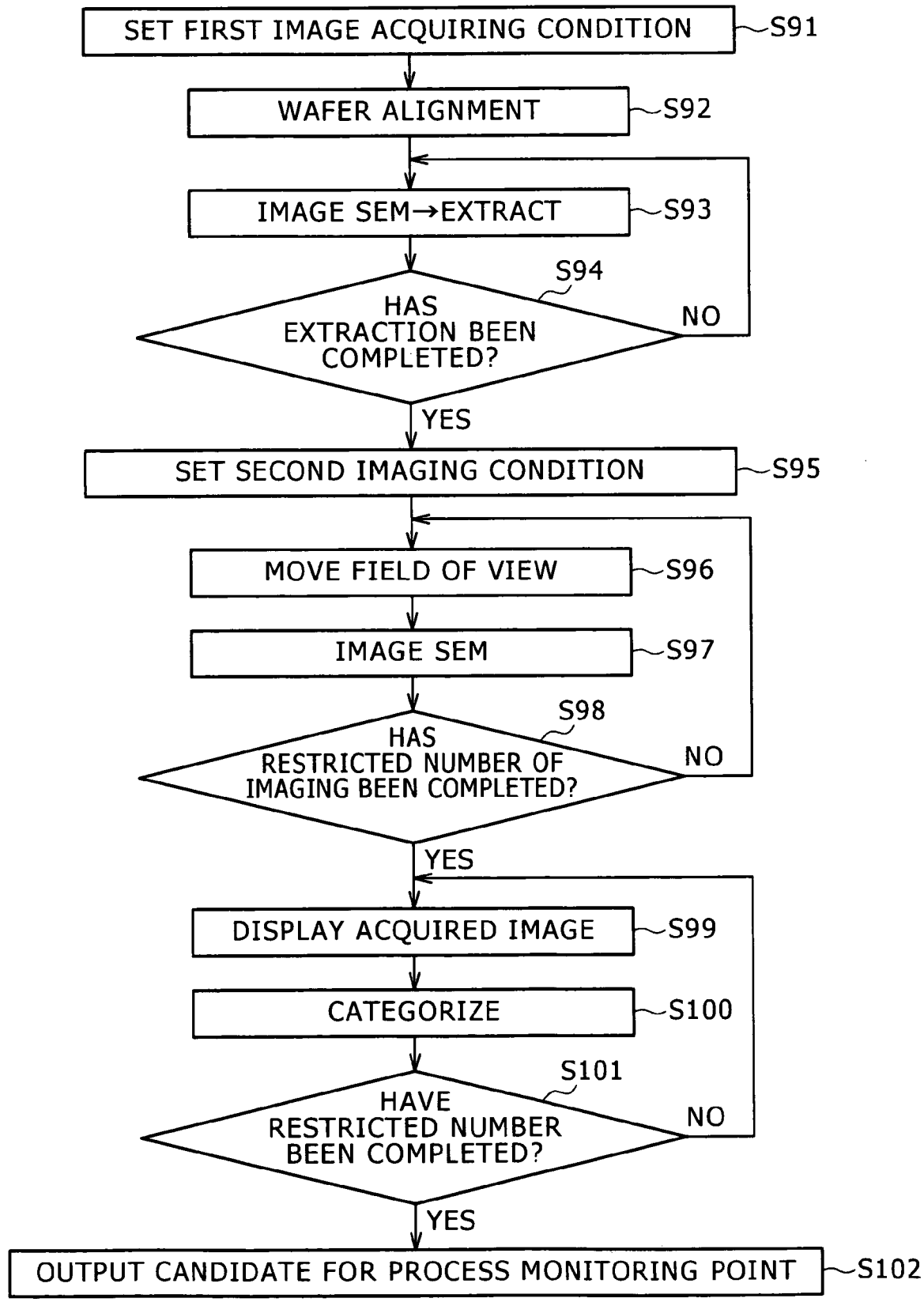
FIG. 9 is a flowchart illustrating an example of sequences according to which a hotspot searching apparatus according to an exemplary embodiment of the present invention searches for and determines process monitoring points.

Next, an example of whole sequences of the hotspot searching apparatus 11, 12 according to this exemplary embodiment of the present invention will be described with reference to FIG. 9. First, in the electro-optic system-based operation-condition setting unit 332, a first image acquiring condition for extracting a PMP candidate (an image acquiring condition of a low magnification, for example, 5000-fold to 20000-fold magnification) is set to a SEM (S91). Next, images of plural points of an alignment mark on, for example, an FEM wafer are acquired by the SEM and wafer alignment is performed (S92). Subsequently, low-powered images are acquired while the XY stage 317 is moved such that the field of view of the low-power SEM moves between a first shot and a second shot on which PMP candidate extraction will be performed, and PMP candidates each having a great difference (including coordinates) are extracted in the above-mentioned manner (S93). The steps are repeated until low-powered SEM images of all extraction regions of the shots are acquired (S94).

Next, a second image acquiring condition (an image acquiring condition of a high magnification) for acquiring detailed image of PMP candidates is set as an image acquiring condition of the SEM (S95). The field of view of the high-power SEM is moved such that one of the extracted PMP candidates having a greater difference with respect to design data comes within the field of view (S96), and an SEM image of the candidate is acquired under the second image acquiring condition (S97). In order to extract a candidate having a comparatively greater shape difference with respect to design data, a method of aligning and comparing the low-powered SEM image and the image of the design data obtained from the image converting unit 362 by the alignment unit 345 and extracting a candidate having a comparatively great shape difference by the great-difference region extracting unit 347 may be used.

The field of view may be moved by any one of a method of moving the XY stage 317 holding a wafer 308 and a method of changing a region irradiated with an electron beam, or a combination thereof. Next, SEM image acquisition under the second image acquiring condition is repeated until images of all the PMP candidates each having a comparatively greater shape difference are acquired (S98). In the case where the number of PMP candidates is remarkably large in the second image acquiring condition, an upper limit of the number of SEM images to be acquired may be set, ones of the PMP candidates whose amount of shape deformation is large or in which thick wiring lines has been detected on the basis of the design data may be selected, and image acquisition may be performed to the upper limit.

Next, the high-powered SEM images sequentially acquired are displayed on the GUI terminal 350 (including the computer 12) (S99). Categories corresponding to bridges, short circuits, thick, thin, foreign materials, false information, etc., are added to the displayed high-powered SEM images, or a code on whether each displayed high-powered SEM image is set as a PMP candidate is added to the corresponding high-powered SEM image (S100). The above-mentioned steps are repeated on a predetermined number of high-powered SEM images (S101).

An example of a GUI is shown in FIGS. 10A to 10D. Reference numeral 641 shown in FIG. 10A represents design data of a shot and coordinates of PMP candidates are displayed thereon. Reference numeral 642 shown in FIG. 10D represents an image of a PMP candidate having been acquired under the second image acquiring condition. In the hotspot searching apparatus 11, 12, when an evaluation is performed through design data comparison, a difference between two shots does not clearly represent which one is deviated from a designed shape. In this case, SEM images of the same coordinates of two shots are acquired under the second image acquiring condition. Further, when images of two shots are acquired under the second image acquiring condition, it is preferable that the GUI terminal 350 (corresponding to the computer 12) switches and displays the two images in order for the user determines whether it is a PMP. Furthermore, it is preferable that the GUI can display a difference calculated by the difference calculating unit 346. Moreover, a difference may be recorded on a design data image or a SEM image acquired in an overlay state.

Reference numeral 643 shown in FIG. 10B represents design data corresponding to the image 642. Further, reference numeral 646 represents an area where the ID of the design data 643 is displayed. Reference numeral 644 represents a code input entry to input a category code corresponding to a bridge, a short circuit, thick, thin, a foreign material, false information, etc. or a coarse classification code, for example, "1" or "0" corresponding to whether a point is a PMP candidate or not (S100).

If a code is input, a category for which any code has not been input is sequentially displayed and then a code input screen for the category is displayed. The GUI may display the code input screen on the GUI terminal 350 of the hotspot searching apparatus 11. Alternatively, the GUI may transmit SEM images acquired by the hotspot searching apparatus 11 to an external computer 12 through the network 17 such that code addition can be performed in a GUI on the computer 12. Reference numeral 645 shown in FIG. 10A represents a wafer from which the SEM image 642 is acquired.

In the case of some categories such as foreign materials or false information or codes corresponding to points which are not PMP candidates of the categories having codes added thereto or the codes, the points corresponding thereto are excluded from PMP candidates by the PMP candidate narrowing-down unit 348. The coordinates, categories, and SEM images of the finally remaining PMP candidates are output to the PMP managing apparatus 15 (S102), and the finally remaining PMP candidates are used in the separate PMP monitoring apparatus 16 (such as a CD-SEM).

Further, defects may be automatically classified in a pre-process in which code addition is performed in the GUI or in the great-difference region extracting unit 347 in stead of the pre-process. Three examples of the classification method are the following.

A first method uses a feature quantity of an SEM image. Pattern brightness, edge acutance, or size of each shape deformation part of a difference region of two shots is extracted as a feature quantity and discrimination is performed in a feature quantity space by a classifier such as a neural network.

A second method uses coordinates of shape deformation parts. This method is described with reference to FIGS. 10A to 10D. The greatest difference between random defects such as foreign materials which are not influenced by a change in a process and PMPs for monitoring systematic defects extracted according to exemplary embodiments of the present invention is that, in the case of the systematic defects, shape deformation of a pattern becomes greater as the systematic defects go away from a center of a process window.

Figure 11:
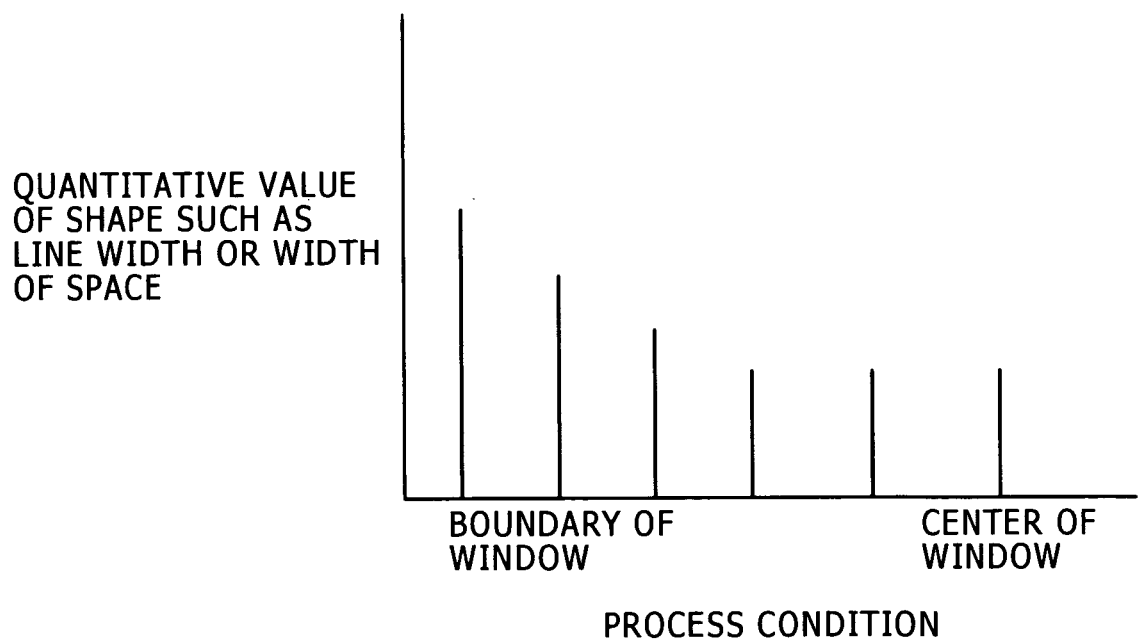
FIG. 11 is a plot illustrating line widths of the same pattern in different shots according to a process condition.

FIG. 11 shows line widths of a same pattern of different shots according to process conditions. Random defects such as foreign materials are independently generated in some shots. In contrast, in the case of systematic defects, there is a trend in that a pattern shape is more greatly deformed as the systematic defects go away from a center of a process window. On the basis of this trend, independent shape deformations are determined as random defects and the other cases are determined as systematic defects.

A third method determines systematic defects on the basis of coordinate matching with location coordinates where it is determined that a process margin obtained from the lithographic simulator 14 is small. A point where a systematic defect will be generated is predictable by the lithographic simulator 14 and defects detected at a position where it is determined by the lithographic simulator 14 that a process margin is small may be determined as systematic defects.

Next, the PMP managing apparatus 15 according to the exemplary embodiment of the present invention will be described in detail. The PMP managing apparatus 15 searches the design data obtained from the design data server 13 for the same patterns as the PMP candidates output from the hotspot searching apparatus 11, 12 (the GUI terminal 350) and finally determines some of them as PMPs in other positions of the shots. This is because there are points which are greatly influenced by a change in a process such that defects are easily generated, and points where defects are rarely generated in spite of a change in a process even in the same pattern according to a pattern density of the vicinity. For example, that is because, in a case of a memory, the degree of systematic defects generation in the same pattern is different in the central part and peripheral part of a memory cell and thus a possibility that a defect of a boundary part of a memory cell having been recognized may be generated in other cell boundary parts becomes high.

As described above, on the basis of the SEM images, categories, and coordinates of the finally remaining PMP candidates output from the hotspot searching apparatus 11, 12 (the GUI terminal 350), the PMP managing apparatus 15 finally determines PMPs by using the design data (including images into which the design data are converted) obtained from the design data server 13 and/or the lithographic simulation results obtained from the lithographic simulator 14, and provides them to the PMP monitoring apparatus 16.

Next, an example of the PMP monitoring apparatus composed of a CD-SEM, an AFM, a SIM, etc., according to this exemplary embodiment of the present invention will be described in detail with reference to FIG. 12. The PMP monitoring apparatus 16 according to this exemplary embodiment of the present invention acquires images of the PMPs determined by the PMP managing apparatus 15 and performs at least one of shape inspection and shape length measurement. At this time, image acquisition may be performed on the wafer from which the hotspot searching apparatus 11, 12 has extracted the PMPs or another wafer.

With respect to the wafer from which the hotspot searching apparatus 11, 12 has extracted the PMPs, images of shots for which process conditions are different from each other and a range in which a pattern can be normally formed, that is, a process window for each PMP based on the shape inspection or shape length measurement of the pattern is obtained. In order to obtain the process window, for example, a method of obtaining line widths of patterns and a distance between patterns from SEM images acquired in PMPs of different shots of a wafer, for example, a FEM wafer on which patterns have been formed in shots for which process conditions are different from each other, of comparing the line widths of patterns or the distance between patterns with design data to select a shot for which the difference with the design data is within a permissible range, and obtaining a process window on the basis of the process condition of the shot may be used.

The above-mentioned process may be performed on an FEM wafer from which the hotspot searching apparatus 11, 12 has not extracted PMP candidates. Further, images of patterns of PMPs may be acquired from mass-produced wafers, that is, wafers expected to have patterns formed in a center of a process window, and whether a process condition for pattern formation is the best one may be checked through shape inspection or shape length measurement. Alternatively, an image of coordinates of a pattern, greatly influenced by a change in a process, of each PMP candidate may be acquired from a shot, having a different process condition, of the wafer used in the hotspot searching apparatus 11, 12 so as to be used to obtain a region where the pattern can be normally formed, that is, a process window. Further, PMP candidates may be output to another apparatus different from the hotspot searching apparatus 11, 12 to be subjected to fixed point observation or fixed point inspection. Examples of a fixed point observation apparatus include a CD-SEM, an AFM, a review SEM, etc.

Examples of an image acquiring unit of the PMP monitoring apparatus 16 include a CD-SEM, an AFM, etc. An example having a configuration using a CD-SEM is shown in FIG. 12. An electro-optic system of the CD-SEM includes an electron gun 701 for emitting an electron beam, two condenser lenses 702 and 703 for condensing an electron beam, deflectors 705 and 706 for deflecting an electron beam, an objective lens 707, an ExB 710 for deflecting secondary electrons and/or reflected electrons generated from a semiconductor wafer 708, and an electron detector 711 for detecting the secondary electrons and/or reflected electrons deflected by the ExB 710. A SEM image signal output from the electron detector 711 is converted into a digital image signal by an A/D converter 712 and is stored in a storing unit 742. The storing unit 742 includes at least parts 743 and 744 for storing image signals to be compared.

Reference numeral 717 represents an XY stage which includes a measuring instrument for measuring the position of the XY stage, for example, a laser measuring instrument. The position of the stage measured by the XY stage 717 is input to a deflection control unit 731. The electron gun 701 emits an electron beam. The condenser lenses 702 and 703 condense the electron beam. The deflectors 705 and 706 deflect the electron beam in a direction perpendicular to the moving direction of the XY stage 717 so as to scan a wafer 708 with the electron beam. Therefore, the electron detector 711 acquires SEM images from the wafer 708 and the storing unit 743 stores the SEM images as two-dimensional SEM images. The deflection control unit 731 finely controls the deflectors 705 and 706 such that images having the same pixel size can be acquired even though the moving speed of the XY stage is changed when the XY stage 717 is in motion. An alignment unit 745 performs alignment on the basis of a position alignment technique of a peak of the normalized correlation between output images, or the minimum of the sum of squares of the difference between two images, or the absolute value of the difference.

In the hotspot searching apparatus 11, 12 shown in FIG. 4, images acquired from two different shots are compared to extract a point greatly influenced by a change in a process as a PMP candidate. In the configuration of the CD-SEM shown in FIG. 12, a shape of a region of an arbitrary shot which is determined as a PMP by the PMP managing apparatus 15 is measured. Here, a point displayed in a dimension measurement window shown in FIG. 13B is measured.

Figure 13A:
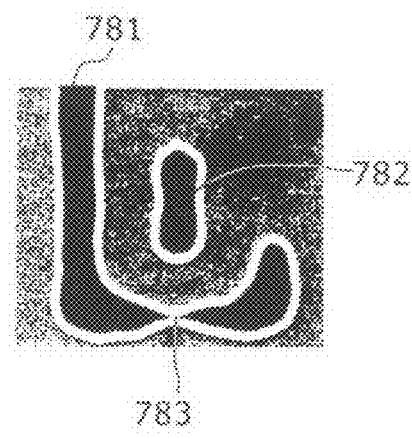
FIG. 13A is a diagram illustrating a SEM image of a pattern acquired by a CD-SEM.
Figure 13B:
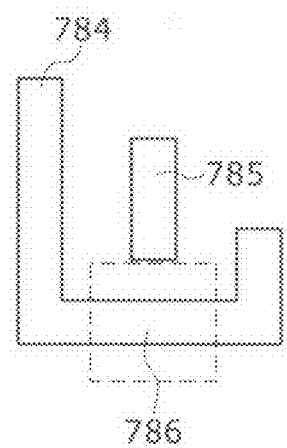
FIG. 13B is a diagram illustrating a pattern shape obtained from design data of a pattern corresponding to a region from which a SEM image has been acquired.

A GUI indicating a dimension measurement point is shown in FIGS. 13A and 13B. Reference numerals 781 and 782 represent patterns from which an image has been acquired by a CD-SEM, and reference numeral 783 represents a region where necking has been generated. Reference numerals 784 and 785 represent design shapes corresponding to the patterns 781 and 782, respectively.

Reference numeral 786 represents a window for dimension measurement. Since the necking is generated in the region 783, the coordinates of a point having the smallest line width in the region 783 are set automatically or by a user.

In order for dimension measurement, for example, a method of pursuing edges of an SEM image of the window 786 and measuring the dimensions of the position having the smallest line width or a method of projecting a white band of a SEM image and performing dimension measurement may be used.

In the case in which the coordinates are automatically set, a measurement point setting unit 746 compares a pattern including the coordinates of a shape deformation part input from the PMP data input unit 761 and extracted by the hotspot searching apparatus 11, 12, with design image data which are obtained from the design data by the image converting unit 762 to obtain how the pattern is deformed, and a measuring method suitable to the pattern is selected. For example, if the detected deformation part is a point short-circuited from another pattern or a point neighboring another pattern, a distance from a neighboring pattern is set as a measurement item. If a deformed point is thin, a pattern width is measured. In this way, the measurement point setting unit 746 automatically sets a measurement recipe for PMPs.

Further, in order to measure a point shown in the dimension measurement window 786, it is preferable to set a pixel size to about 1 nm or less. In this case, in order to reduce the image acquiring time, for example, it is required to perform SEM image acquisition in a field of view of 1 μm or less. However, there is a possibility that a pattern for alignment is not found out in the field of view. Further, there is a possibility that a measurement point does not come into the field of view due to a degree of accuracy of movement of a stage or misalignment of the view of field causable by charging.

In this case, a pattern easily aligned in a region which does not require moving the stage is obtained in the vicinity of a PMP in advance. A low-powered SEM image of the obtained alignment pattern is acquired and stored in a first storing unit 743. The alignment unit 745 compares the low-powered SEM image with design data stored in a third storing unit 744 to calculate a coarse position deviation amount. On the basis of the calculated position deviation amount, a SEM image of the PMP is acquired at a high magnification. The alignment unit 745 compares the high-powered SEM image of the PMP stored in the first storing unit 743 with the design data stored in the third storing unit 744 to obtain an accurate position deviation amount. On the basis of the obtained accurate position deviation amount, the measurement point setting unit 746 sets a measurement point, and a measuring unit 747 measures the set measurement point.

In order to realize this, first, design data of each PMP and alignment patterns set in the vicinity of the corresponding PMP are input from the PMP data input unit 761 to the image converting unit 762. The image converting unit 762 converts the input design data of each PMP and the alignment patterns therefor into images and the third storing unit 744 stores the images. A stage control unit 733 moves a stage 717 such that the alignment patterns come into the field of view of the SEM and performs image acquisition at a low magnification (about 5000-fold to 20000-fold magnification). The first storing unit 743 stores the acquired images. Then, the alignment unit 745 compares the SEM images of the alignment patterns stored in the first storing unit 743 with the design image data stored in the third storing unit 744, obtains a deviation amount of a defect position on the basis of the results of the comparison, and transmits the obtained deviation amount to the deflection control unit 731.

The deflection control unit 731 obtains a deviation control amount required to acquire images of PMPs, on the basis of the coarse deviation amount of the defect position and acquires image of the PMPs at a high magnification (about 20000-fold to 100000-fold magnification). The SEM images acquired at the high magnification are stored in the first storing unit 743 and are compared with the design data images of the PMPs stored in the third storing unit 744 in the alignment unit 745, and an accurate position deviation amount is obtained.

The measurement point setting unit 746 performs measurement point setting on the basis of the accurate position deviation amount, and the measuring unit 747 extracts pattern edges from the SEM images of the PMPs and calculates pattern widths and amounts of deformation from the design data. The calculated deformation amounts are stored in a secondary storing apparatus 749 and are transmitted through an external input/output control unit 735 to an arbitrary apparatus connected to an external network. Further, a whole control system 730 performs the above-mentioned sequences until measuring all the designated PMPs is completed.

Moreover, examples of the PMP monitoring apparatus 16 according to this exemplary embodiment of the present invention may includes a measuring apparatus including an AFM or a SIM having a light source using an ion beam, in addition to a CD-SEM.

Second Embodiment

Next, a process monitoring system according to a second embodiment of the present invention will be described with reference to FIG. 14.

In the first embodiment of the present invention shown in FIG. 3, a method has been described in which the hotspot searching apparatus (Hotspot searcher) 11, 12 performs switching between the first image acquiring condition and the second image acquiring condition, acquires higher-resolution SEM images of the PMP candidates detected under the first image acquiring condition (an image acquiring condition of a high magnification of about 5000-fold to 20000-fold magnification), under the second image acquiring condition (an image acquiring condition of a low magnification of about 20000-fold to 100000-fold magnification), and determines whether to set the PMP candidates as PMPs. However, in the second embodiment, SEM image acquiring under the second image acquiring condition is performed on a wafer 308 subjected to extraction in a separate apparatus 18 (a hotspot monitoring apparatus composed of a review SEM, etc.) and evaluation is performed. A system according to the second embodiment is configured as shown in FIG. 14.

Figure 14:
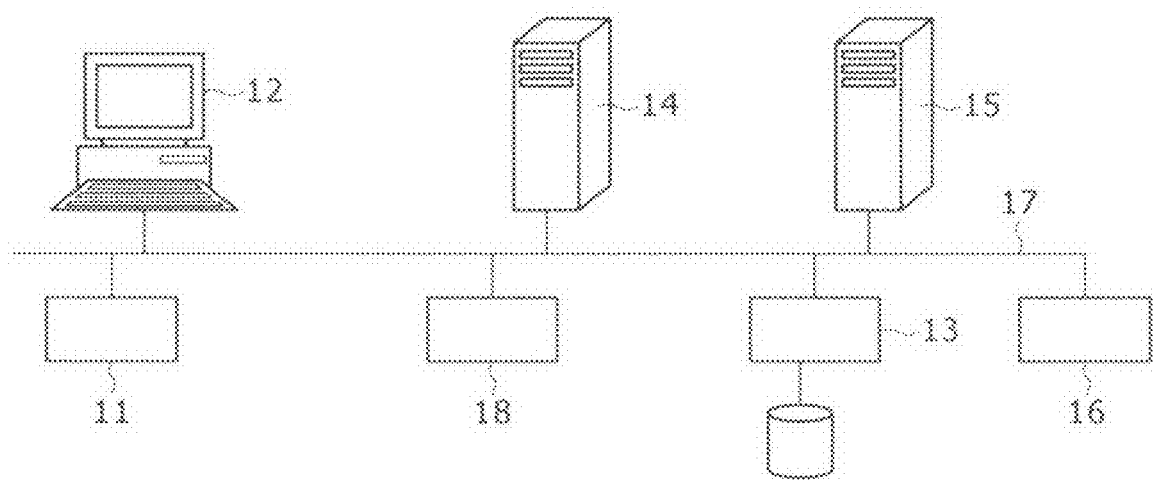
FIG. 14 is a schematic diagram illustrating a configuration of a manufacturing process monitoring system according to a second embodiment of the present invention.

In FIG. 14, components indicated by reference numerals 11 to 17 have the same configuration as those in FIG. 3 and a hotspot monitoring apparatus (hotspot checker) 18 composed of a review SEM, etc. is newly added. The hotspot monitoring apparatus 18 receives the coordinates of the PMP candidates output from the hotspot searching apparatus 11, 12, acquires images of the PMP candidates under the second image acquiring condition having a higher resolution than the image resolution of the first image acquiring condition, and transmits the acquired images and the coordinates thereof to the computer 12 (the GUI terminal 350).

The hotspot monitoring apparatus 18 generally analyzes the acquired images and automatically specifies defect kinds. Images of, for example, foreign materials regarding a change in a process output from the hotspot monitoring apparatus 18 are transmitted to the computer 12 (the GUI terminal 350) and are displayed on the GUI. A user inputs categories through the GUI as described in association with FIG. 10D and whether to exclude points corresponding to the images from the PMP candidates is determined.

In the configuration shown in FIG. 4, the hotspot searching apparatus 11, 12 performs alignment with the design data. However, a case in which alignment with the design data is not performed can be considered. In this case, errors of several μm to several hundreds nm may occur in the coordinates output from the hotspot searching apparatus 11, 12 and are remarkably larger than that causable under the second image acquiring condition for acquiring a high-resolution image of a pattern having a half pitch of 45 nm.

In this case, it is required that, first, the hotspot searching apparatus 11, 12 acquires low-powered SEM images on the basis of the coordinates of the alignment patterns on the wafer and specifies points having a great shape deformation from the images, and the hotspot monitoring apparatus 18 performs high-powered image acquiring under the second image acquiring condition. The hotspot monitoring apparatus 18 may use an image comparing method as the hotspot searching apparatus 11, 12. However, the hotspot searching apparatus 11, 12 does not necessarily compare neighboring dies or shots. Further, in the case of using, for example, a general FEM wafer as a PMP candidate extraction object, process conditions for neighboring shots are approximate to each other.

Therefore, even though shots having approximate process conditions are compared, it is difficult to extract a part where the shape of the pattern has been deformed by a change in the process condition. In this case, the hotspot monitoring apparatus 18 may receive the coordinates of two shots having been compared in the hotspot searching apparatus 11, 12 and perform the equivalent comparison with that in the hotspot searching apparatus 11, 12 by using the high-powered SEM images having high resolutions.

Further, in the case the hotspot searching apparatus 11, 12 does not perform alignment with the design data, the hotspot monitoring apparatus 18 may perform alignment design data, which makes it possible to improve the accuracy of the coordinates of the pattern deformation part output from the hotspot searching apparatus 11, 12. At this time, a method of performing alignment with the design data described in association with the hotspot searching apparatus 11, 12 may be used.

When the hotspot monitoring apparatus 18 performs image acquiring under the second image acquiring condition (image acquiring condition of a high magnification), if which generates a pattern deformation is not clear, it acquires SEM images of patterns of both of shots.

As a method different from the above-mentioned method, the hotspot monitoring apparatus 18 may be configured to have the same structure as that shown in FIG. 4, to perform alignment with the design data, to determine which patterns have been deformed on the basis of comparison with the design data, and to acquire SEM images of only the determined deformed patterns under the second image acquiring condition (image acquiring condition of a high magnification).

As a further different method, the coordinates of a shot determined to be the center of the process window may be input in advance, the pattern shape deformation part output from the hotspot searching apparatus 11, 12 may be compared with the same coordinates of the process window center shot to obtain a difference, a difference region may be extracted as a pattern deformation part, and the hotspot monitoring apparatus 18 may acquire SEM images of the coordinates under the second image acquiring condition.

Further, the hotspot monitoring apparatus 18 may perform automatic determination on whether a point is a process monitoring candidate or not. In order to automatically determine whether a point is a process monitoring candidate or not, the automatic determination method described in association with the hotspot searching apparatus 11, 12 may be applied. Moreover, in the case of evaluating pattern deformation amounts of plural shots shown in FIG. 11, the hotspot monitoring apparatus 18 may be required to acquire SEM images of the coordinates output from the hotspot searching apparatus 11, 12, and SEM image of the coordinates, which are the same as the coordinates output from the hotspot searching apparatus 11, 12, of shots having process conditions approximate to the process condition corresponding the coordinate output from the hotspot searching apparatus 11, 12, under the second image acquiring condition.

In other words, the process monitoring system according to the second embodiment of the present invention may include the hotspot searching apparatus 11, 12 composed of a SEM, the hotspot monitoring apparatus 18 composed of a review SEM, and a PMP monitoring apparatus 16 composed of, for example, a CD-SEM. As described above, the function of the hotspot monitoring apparatus 18 may be included in the hotspot searching apparatus 11, 12 and may be performed in a separate apparatus.

With respect to miniaturized patterns, process monitoring points (PMPs) where systematic defects are easily generated due to a change in a process become clear by the system composed of the above-mentioned apparatuses, and process monitoring based on the PMPs are performed by the PMP monitoring apparatus 16 composed of a CD-SEM, thereby copying with future miniaturization in semiconductor manufacturing processes The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A manufacturing process monitoring apparatus, comprising:
   a hotspot searching apparatus, including a SEM apparatus and an SEM image processing unit, configured to process SEM images obtained by the SEM apparatus when imaging a semiconductor wafer whose surface is formed with patterns, and to search for process monitoring points; and
   a process monitoring point monitoring apparatus configured to evaluate shapes and/or dimensions of circuit patterns of the process monitoring points searched by the hotspot searching apparatus;
   wherein the hotspot searching apparatus is configured to use the SEM apparatus to image the semiconductor wafer having a plurality of regions where circuit patterns have been formed under different manufacturing process conditions, to use the SEM image processing unit to process the SEM images of every region obtained by imaging the semiconductor wafer in order to obtain differences, to extract points where the differences exceed a reference value and to define the extracted points as process monitoring point candidates, and to select a subset of the extracted process monitoring point candidates to be process monitoring points excepting a point corresponding to an insignificant region including a pattern that is meaningless in view of an electric circuit, or where a pattern has been formed in consideration of a pattern change, so as to enable searching for the process monitoring points; and
   wherein the process monitoring point monitoring apparatus is configured to capture the images of the process monitoring points on the basis of the process monitoring points searched by the hotspot searching apparatus, and to evaluate shapes and/or dimensions of circuit patterns of the process monitoring points on the basis of the captured images, in a region on a semiconductor wafer different from the semiconductor wafer on which the process monitoring points have been searched or in a region different from the region on the semiconductor wafer on which the process monitoring points have been searched.

2. The manufacturing process monitoring apparatus according to claim 1,
   wherein the hotspot searching apparatus is configured to perform alignment between the SEM image of a predetermined imaged region and an image obtained from design data, such that the extracted process monitoring point candidates and the design data can be compared.

3. The manufacturing process monitoring apparatus according to claim 1,
   wherein when the SEM images of every region are compared to obtain a difference, the hotspot searching apparatus is configured to extract edge parts of individual circuit patterns from the SEM images of every region and to compare the extracted edge parts, so as to obtain the difference.

4. The manufacturing process monitoring apparatus according to claim 1,
   wherein the hotspot searching apparatus includes a graphic user interface configured to display the extracted process monitoring point candidates.

5. The manufacturing process monitoring apparatus according to claim 4,
   wherein the graphic user interface is configured to simultaneously display extraction regions obtained by a lithographic simulation of the design data together with the process monitoring point candidates.

6. The manufacturing process monitoring apparatus according to claim 1,
   wherein the process monitoring point monitoring apparatus includes a CD-SEM apparatus.

7. A manufacturing process monitoring apparatus comprising:
   a SEM image acquiring unit configured to acquire SEM images of a sample by imaging the sample;
   a process monitoring point searching unit configured to process SEM images obtained by using the SEM image acquiring unit to image, as the sample, a first semiconductor wafer whose surface is formed with patterns, and to search for regions used to monitor a process of forming the patterns; and
   a process monitoring point monitoring unit configured to evaluate shapes or dimensions of patterns formed on a second semiconductor wafer from SEM images obtained by the SEM image acquiring unit by imaging a second semiconductor wafer on the basis of information on regions used to monitor the process searched by the process monitoring point searching unit;
   wherein the process monitoring point searching unit processes the SEM images of every region obtained by imaging, by using the SEM image acquiring unit, the first semiconductor wafer having the plurality of regions on which the patterns have been formed under different process conditions, and to search for regions used to monitor the process excepting a point corresponding to an insignificant region including a pattern that is meaningless in view of an electric circuit, or where a pattern has been formed in consideration of a pattern change.

8. The manufacturing process monitoring apparatus according to claim 7,
   wherein the searching of the regions used to monitor the process by processing the SEM images of every region by the process monitoring point searching unit is performed by processing the SEM images of every region obtained by imaging, by using the SEM image acquiring unit, the first semiconductor wafer to obtain differences, extracting regions including points where the obtained differences exceed a reference value as candidates of the regions used to monitor the process, and narrowing-down the extracted candidates of the regions used to monitor the process.

9. The manufacturing process monitoring apparatus according to claim 7,
   wherein the process monitoring point searching unit is configured to search for the regions used to monitor the process by using a SEM image of a predetermined region on the first semiconductor wafer imaged by the SEM image acquiring unit, and an image obtained from design data corresponding to the predetermined region.

10. The manufacturing process monitoring apparatus according to claim 7,
    wherein when the SEM images of every region are compared to obtain differences, the process monitoring point searching unit is configured to extract the edge parts of the individual circuit patterns from the SEM images of every region and to compare the extracted edge parts, so as to obtain the difference.

11. The manufacturing process monitoring apparatus according to claim 7,
    wherein the process monitoring point searching unit includes a graphic user interface configured to display the extracted process monitoring point candidates.

12. The manufacturing process monitoring apparatus according to claim 11,
wherein the graphic user interface is configured to simultaneously display extraction regions obtained by a lithographic simulation of the design data together with the process monitoring point candidates.

13. The manufacturing process monitoring apparatus according to claim 7,
wherein the process monitoring point monitoring unit includes a CD-SEM apparatus.

14. A manufacturing process monitoring method comprising:
imaging, as a sample, a first semiconductor wafer whose surface is formed with patterns by an SEM image acquiring unit and acquiring the SEM image of the first semiconductor wafer;
processing the acquired SEM images of the first semiconductor wafer to search for regions used to monitor a process of forming the patterns;
imaging a second semiconductor wafer by using the SEM image acquiring unit, on the basis of information on the searched regions used to monitor the process; and
processing the SEM images of the regions used to monitor the process obtained by imaging the second semiconductor wafer and evaluating shapes or dimensions of patterns formed on the second semiconductor wafer;
wherein, the searching for the regions used to monitor the process processes the SEM images of every region obtained by using the SEM image acquiring unit to image the first semiconductor wafer having the plurality of regions on which the patterns have been formed under different process conditions and to search for regions used to monitor the process excepting a point corresponding to an insignificant region including a pattern that is meaningless in view of an electric circuit, or where a pattern has been formed in consideration of a pattern change.

15. The manufacturing process monitoring method according to claim 14,
wherein in the searching for the regions used to monitor the process, the searching of the regions used to monitor the process by processing the SEM images of every region is performed by processing the SEM images of every region obtained by using the SEM image acquiring unit to image the first semiconductor wafer to obtain differences, extracting regions including points where the obtained differences exceed a reference value as candidates of the regions used to monitor the process, and narrowing-down the extracted candidates of the regions used to monitor the process.

16. The manufacturing process monitoring method according to claim 14,
wherein in the searching for the regions used to monitor the process, the regions used to monitor the process are searched by using the SEM images of a predetermined region on the first semiconductor wafer imaged by the SEM image acquiring unit and images obtained from design data corresponding to the predetermined region.

17. The manufacturing process monitoring method according to claim 14,
wherein in the searching for the regions used to monitor the process, when the SEM images of every region are compared to obtain differences, edge parts of individual circuit patterns are extracted from the SEM images of every region and the extracted edge parts are compared, so as to obtain the difference.

18. The manufacturing process monitoring method according to claim 14,
wherein in the searching for the regions used to monitor the process, the extracted process monitoring point candidates are displayed on a screen by a graphic user interface.

19. The manufacturing process monitoring method according to claim 18,
wherein the graphic user interface is configured to simultaneously display extraction regions obtained by a lithographic simulation of the design data together with the process monitoring candidates.

20. The manufacturing process monitoring method according to claim 14,
wherein in the evaluating shapes or dimensions of patterns formed on the second semiconductor wafer, the SEM images of the regions used to monitor the process obtained by imaging the second semiconductor wafer is acquired by using a CD-SEM.

* * * * *